(12) United States Patent
Karpinski

(10) Patent No.: US 6,757,309 B1
(45) Date of Patent: Jun. 29, 2004

(54) LOW INDUCTANCE LASER DIODE ARRAYS, LASER DIODE ARRAY ASSEMBLIES, AND FABRICATION THEREOF

(75) Inventor: Arthur A. Karpinski, Jordan, NY (US)

(73) Assignee: Laser Diode Array, Inc., Auburn, NY (US)

(*) Notice: Subject to any disclaimer, the term of this patent is extended or adjusted under 35 U.S.C. 154(b) by 82 days.

(21) Appl. No.: 10/291,956

(22) Filed: Nov. 7, 2002

Related U.S. Application Data

(60) Provisional application No. 60/345,940, filed on Nov. 7, 2001.

(51) Int. Cl.[7] ............................................. H01S 3/04
(52) U.S. Cl. ...................................................... 372/36
(58) Field of Search ........................................ 372/36, 34

(56) References Cited

U.S. PATENT DOCUMENTS

| | | | | |
|---|---|---|---|---|
| 3,441,737 A | * | 4/1969 | Topol | 250/564 |
| 4,597,086 A | * | 6/1986 | Kimbara | 372/61 |
| 4,826,777 A | * | 5/1989 | Ondris | 438/80 |
| 5,040,187 A |   | 8/1991 | Karpinski | |
| 5,172,389 A | * | 12/1992 | Horiuchi et al. | 372/87 |

* cited by examiner

Primary Examiner—Leon Scott, Jr.
(74) Attorney, Agent, or Firm—Sughrue Mion, PLLC

(57) ABSTRACT

A laser diode array, having one or a plurality of electrically mounted laser diode bars, in which current paths through the array are sufficiently parallel and close together to result in a substantial reduction of inductance. As a result, higher duty cycles at lower pulse widths are possible. In some embodiments, a heatsink is provided as part of an overall assembly. The heatsink may provide part or all of a return portion of the current path for the array. Alternatively, the heatsink may be insulated from the rest of the array. The array itself may be fabricated in any of a number of known manners.

36 Claims, 6 Drawing Sheets

LOW INDUCTANCE LASER DIODE ARRAYS, LASER DIODE ARRAY ASSEMBLIES, AND FABRICATION THEREOF

The present application claims benefit of domestic priority from Provisional Application No. 60/345,940, filed Nov. 7, 2001. The present application incorporates by reference the disclosure of that provisional application.

FIELD OF THE INVENTION

High speed on-off switching of laser diode arrays requires the fabrication of laser diode array assemblies with the lowest inductance possible. To accomplish lower inductance, the current path into the array (from the power source), through the array, and out of the array (back to the power source) needs to be as short as possible. The input and output lines through the array need to be as close to each other as possible and, if possible, parallel or substantially parallel to each other.

BACKGROUND OF THE INVENTION

Laser diode arrays can be run continuously, in a manner known as continuous wave (CW) operation. CW operation usually involves providing drive current to the arrays on the order of 0 to 40 amps continuously.

Laser arrays can also be operated in a pulsed fashion, which is known as quasi continuous wave (QCW) operation. QCW operation usually involves providing drive current to the arrays on the order of 0 to 200 amps. Even higher drive currents are expected in the near future. Pulsed operation usually involves pulse widths in a range of less than 1 us to more than 100 ms, with most applications being in the 100 to 500 us pulse width range. These pulses are then usually repeated at intervals from 1Hz to several kHz.

FIG. 1 shows a configuration of a typical laser diode array 100 with laser diode bars 105 disposed in a substrate 115. When current is applied to the array 100, the laser diode bars 105 emit laser light generally in a direction 110.

To apply current to the array 100, a cathode connection 120 and an anode connection 130 are connected to opposite sides of the array 100. As also shown in FIG. 1, a heatsink 140 is provided below array 100, and insulation 150 is interposed between heatsink 140 and the respective cathode and anode connections 120, 130.

Metallization 155 around the substrate 115 and, as necessary or appropriate, around the laser diode bars 105 (except over the emission points of those bars, of course), enables the wrapping of current around the end of the laser diode array. The current flows in the direction of arrows 160.

In the just-described arrangement, distances between cathode and anode connections 120, 130 will be a function of the width of the heatsink 140, which in turn will be a function of the width of the laser diode array 100. The distance between those connections 120, 130 tends to be relatively substantial, on the order of 10 mm, depending on considerations such as the number of laser diode bars in the array 100 (dictating, to some extent, the width of the array 100); the dimensions of the heatsink 140 on which the array is mounted; the amount of insulation 150 that is needed between the cathode and anode connections 110, 120 and the heatsink 140; and the like.

With the configuration of FIG. 1, pulsed operation like that described earlier is attainable.

When operating at somewhat longer pulse widths, on the order of 100 us and above, the "Rise and Fall Time" of the current pulse is of less of a concern. The "Rise and Fall Time" of a current pulse from 0 current to full drive, say, 100 amps, and then from full drive current back to 0 amps is usually on the order of 1 us to 20 us, which is not a large concern when the actual pulse width itself is on the order of 100 us or more.

The "Rise and Fall" time of a current pulse becomes more of a concern as the actual pulse width becomes shorter and shorter, and the intervals between pulses become shorter and shorter. For example: If the required pulse width is 1 us, then the rise and fall time of the current pulse has to be considerably shorter. Rise and fall times are affected greatly by the inductance of the current path, especially when trying to switch on and off high current pulses. So, in order to have faster rise times, it is important to keep the inductance of the entire system as low as possible.

Inductance in high current pulsed systems can be minimized by keeping the power leads as close to each other as possible and, if possible, as parallel or substantially parallel to each other as possible, in order to cancel out magnetic fields which high current flows create. However, while making power leads that are close and parallel to each other is relatively easy, creating the same lower inductance conditions in laser diode arrays is not.

Because of prior operating parameters for laser diode arrays, it has not been necessary to investigate the need for low inductance arrays. However, as needs have changed, with shorter pulse widths and faster repetition rates, it has become necessary to investigate array configurations, and in particular anode/cathode configurations, which will provide sufficiently low inductance to enable fast rise and fall times.

SUMMARY OF THE INVENTION

In view of the foregoing, there has arisen a need for laser diode arrays, still capable of operating at very high drive currents, on the order of 50 to 200 amps per pulse, but operating with pulse widths of less than 1 us and at very short intervals between pulses, leading to laser diode arrays with pulsed operations on the order of 100 kHz and above, more than two orders of magnitude higher than QCW rates at which laser diode arrays have typically operated. It is the need for these shorter and shorter pulse widths, combined with higher and higher drive currents, that has led to a need to fabricate of laser diode arrays with the lowest inductance possible.

To achieve these and other objects, according to the present invention, a low inductance laser diode array is provided in which, in an exemplary embodiment, the cathode and anode connections to the array are positioned substantially parallel to each other, and more closely together than has been the case previously.

DETAILED DESCRIPTION OF EMBODIMENTS

By way of introduction, it is noted that, in a typical laser diode array, there will be a current path by which current passes from a current source and enters the array, passes through one or more diode bars which are mounted in the array, and then returns to the current source. Typically at least part of this current path will be along the upper surface of the array, to some extent, because that will be the easiest way to provide a current path through all of the laser diode bars. Diode bar mounting techniques such as various known-flavors of "Rack'n Stack," or the inventor's own patented technique, shown for example in U.S. Pat. No. 5,040,187, which is incorporated by reference here, will provide a current path as just described. Alternatively, diode bars may be mounted in a conductive substrate, as in another of the inventor's patents, U.S. Pat. No. 5,128,951, which also is incorporated by reference here.

Figure 1:
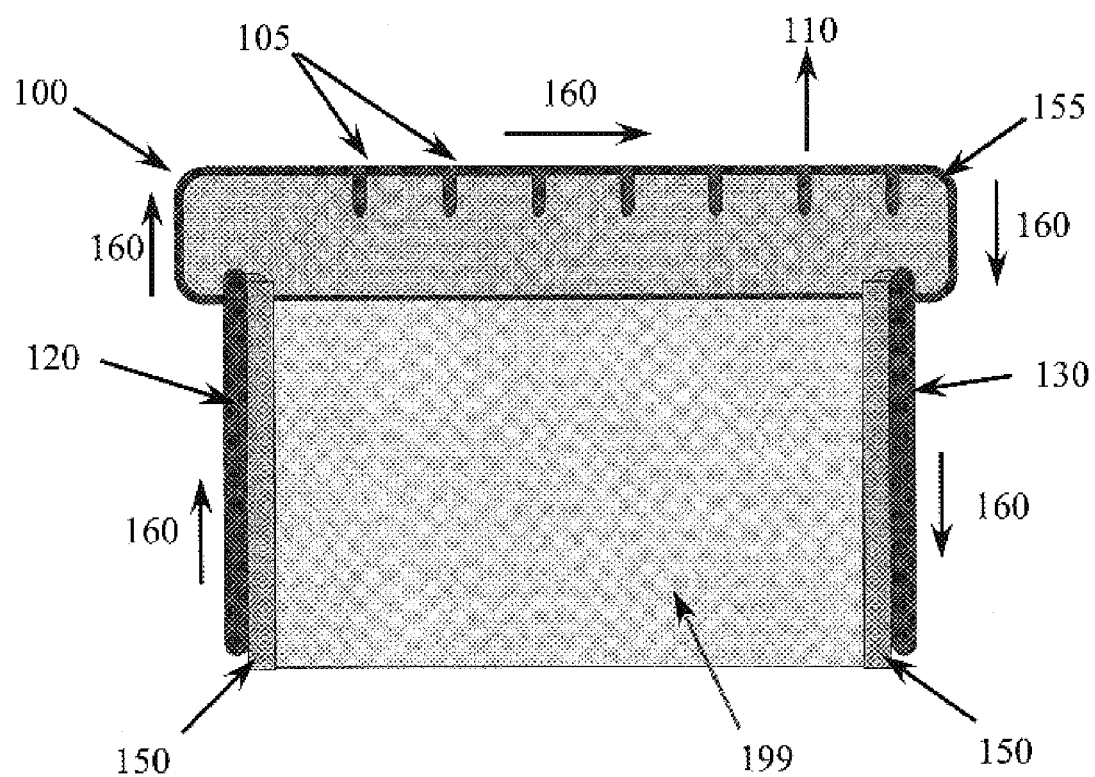
FIG. 1 shows a typical laser diode array mounted on a heatsink, with its anode and cathode connections.

In any of the above-mentioned laser diode array structures, there is an upper conductive layer, of one form or another, through which current enters the array from one "end," travels through the array, exits from the other "end," and goes back to the current source. FIG. 1 shows an example of this path.

However, the FIG. 1 path is relatively long. As a result, as discussed earlier, the inbound and outbound current paths will not be in close proximity to each other. The distance between the inbound and outbound current paths can cause relatively substantial inductance as compared to an array with the current paths in closer proximity to each other.

In accordance with the invention, then, an array is fabricated with two current paths, one of which is the current path through the array, and the other of which is the current path back to the source. These two current paths are provided in close proximity to each other and, if possible, parallel or substantially parallel to each other. As a result, it is possible to lower the overall array inductance, thus enabling a decrease in the rise and fall times of the array, and thus in turn allowing an array to be driven effectively by faster pulses.

Figure 2:
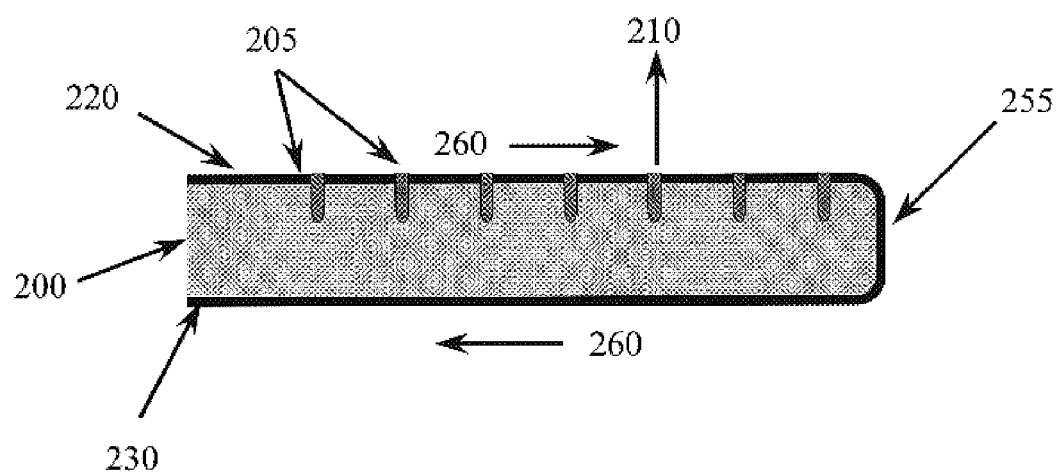
FIG. 2 shows one configuration of the inventive low inductance laser diode array, with its anode and cathode connections.

FIG. 2 shows one configuration of the inventive array 200 with the inventive current path configuration. In FIG. 2, laser diode bars 205 are mounted in substrate 215. Cathode connection 220 is provided on top of the array 200, and anode connection 230 is provided on the bottom of the array 200. A conductive layer 255 is provided around the array so that there is an electrical path between the cathode and anode connections 220, 230. With this electrical path, current flows in the direction of arrows 260. Effectively, the distance between the cathode and anode connections 220, 230 is substantially the thickness of substrate 215, rather than the width of the substrate, as is the case in the configuration of FIG. 1.

Comparing FIGS. 1 and 2, it is apparent that current paths in FIG. 2 are much closer to each other than in the configuration of FIG. 1. The FIG. 2 current paths also are substantially parallel to each other. As a result, the FIG. 2 configuration will provide lower inductance as compared with the FIG. 1 configuration.

Figure 3:
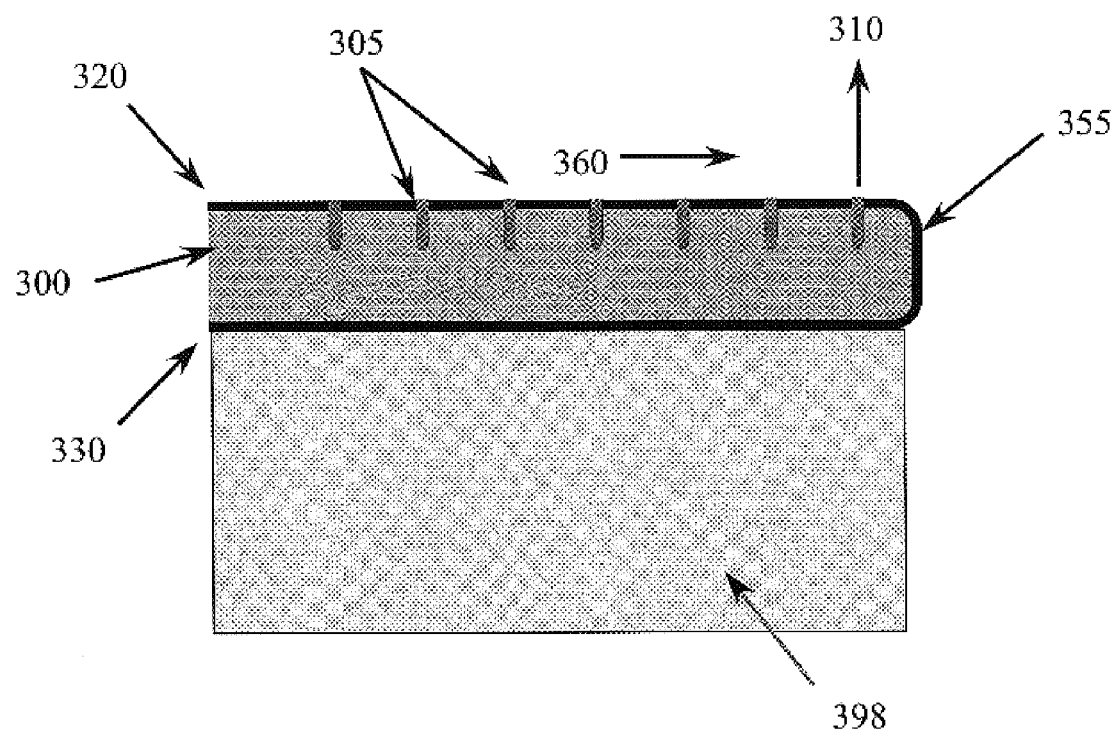
FIG. 3 shows the array of FIG. 2, mounted on a heatsink.

FIG. 3 shows a laser diode array 300 with laser diode bars 305 mounted in substrate 315, yielding laser emission direction 310 as shown. Array 300 is attached to a heatsink 340. The heatsink 340 typically is made of copper, though other metals or materials can be used. In this embodiment, in the absence of insulation between the array and the heatsink, the heatsink 340 will not be electrically isolated from the array 300. The array 300 may be mounted to the heatsink 340 in any of a number of known manners, well within the abilities of the ordinarily skilled artisan, and so the mounting details need not be described here. As with the embodiment of FIG. 2, cathode connection 320 and anode connection 330, and the provision of a conductive layer 355 around the substrate 315 provide a current path 360 in which the "inbound" and "outbound" paths are substantially parallel to each other, and are separated from each other essentially by the thickness of substrate 315.

Figure 4:
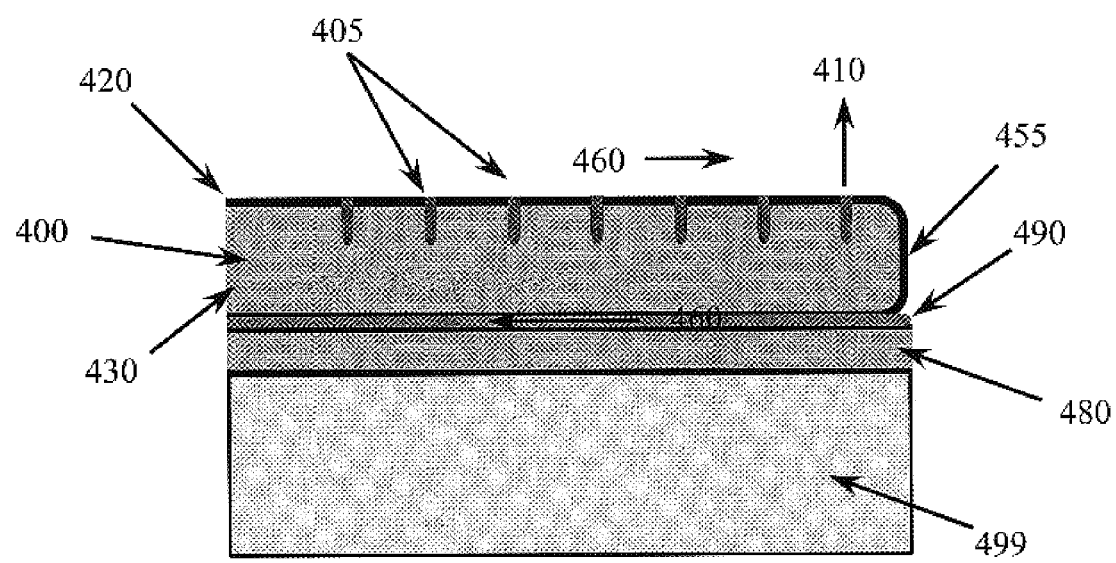
FIG. 4 shows another mounting configuration of the inventive low inductance laser diode array, with an insulated heatsink.

FIG. 4 shows a variant of FIG. 3. In FIG. 4, a laser diode array 400 comprises a plurality of laser diode bars 405 mounted in a substrate 415, yielding laser emission direction 410, with cathode connection 420 and anode connection 430 as shown. A conductive layer 455 yields a current path 460 as shown. The array 400 is mounted on heatsink 440, this time with an electrical isolation layer 480 is interposed between the heatsink 440 and the array 400, and a solder or adhesive joint 490 provided between the array 400 and the isolation layer 480. The isolation layer 480 may be beryllium oxide (BeO), another ceramic, or any such suitable electrical isolator.

Figure 5:
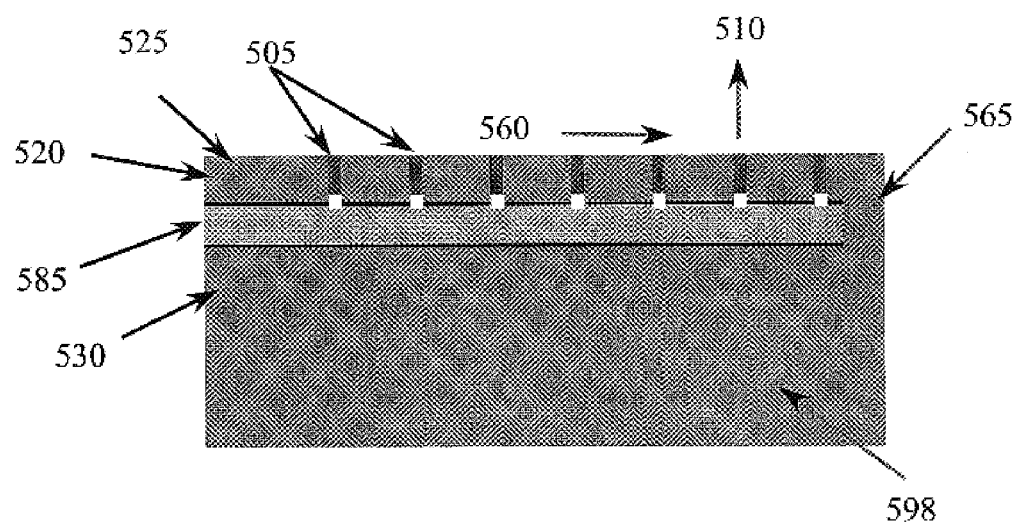
FIG. 5 shows yet another mounting configuration of the inventive low inductance laser diode array.

FIG. 5 shows a further variant in which a laser diode array 500 has laser diode bars 505 mounted in a conductive layer 525 which constitutes the array substrate. In the preceding embodiments shown in the earlier Figures, the laser diode array 100, 200, 300, 400 could be fabricated using any number of techniques which are well known to ordinarily skilled artisans, such as the various known flavors of a technique known as "Rack'n Stack". Another technique, different from "Rack'n Stack," is described in U.S. Pat. No. 5,040,187, which is incorporated by reference herein.

In contrast to the arrays of FIGS. 1–4, the array 500 of FIG. 5 may be fabricated as described, for example, in U.S. Pat. No. 5,128,951, which is incorporated by reference herein. One difference between what is shown expressly in U.S. Pat. No. 5,128,951 and the array shown in FIG. 5 is a further conductive portion 565 at the right hand side of FIG. 5, to facilitate the completion of a current path 560 from the cathode connection 520 to the anode connection 530. The portion 565 may be an integral part of conductive layer 525.

In the FIG. 5 embodiment, there also is a insulative portion, or isolation layer 585. The FIG. 5 isolation layer 585 does not extend all the way between the array 500 and the heatsink 540. Instead, the further conductive portion 565 connects the conductive layer 525 to the heatsink 540, completing the current path from cathode portion 520 to anode portion 530.

Figure 6:
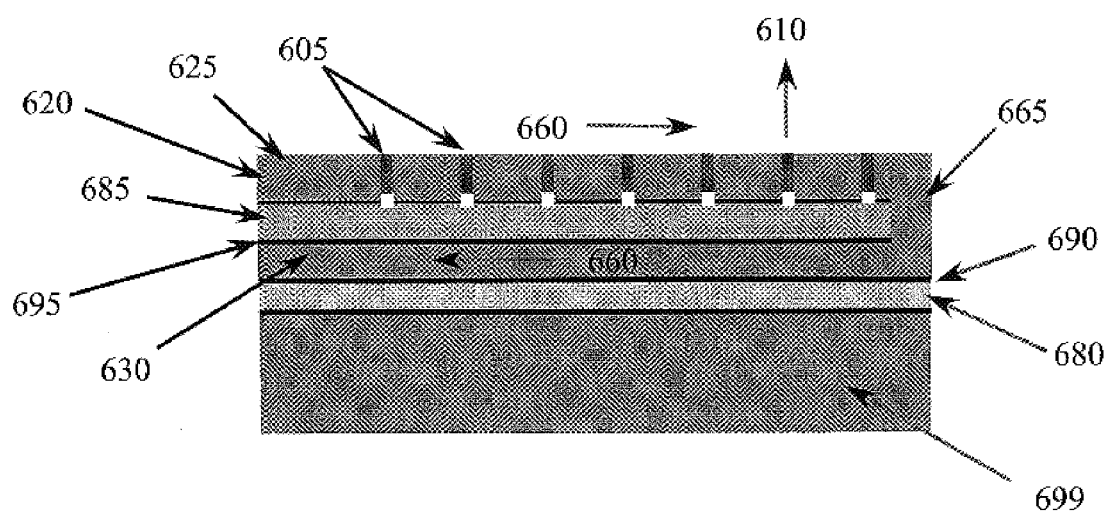
FIG. 6 shows a configuration similar to that of FIG. 5, but with an insulated heatsink.

Finally, the embodiment shown FIG. 6 has aspects similar to those of FIGS. 4 and 5, as follows. In FIG. 6, a laser diode array 600 comprises laser diode bars 605 mounted in a conductive layer 625, yielding laser emission direction 610 as shown. An additional conductive portion 665, which may be an integral part of the conductive layer 625, extends downwardly, a little more deeply than the rest of conductive layer 525, similarly to the FIG. 5 embodiment. An isolation layer 680 is interposed between the array 600 and heatsink 640, similarly to the FIG. 4 embodiment. In addition, a solder or adhesive joint 690 is provided between isolation layer 680 and array 600. Cathode connection 620 and anode connection 630 are at the left-hand side of FIG. 6, similarly to the other embodiments. In one version of the FIG. 6 embodiment, conductive layer 695 may be provided underneath insulative layer 685, to complete the current path 660 between cathode connection 620 and anode connection 630. The conductive 695 may be the same material as (and even integral with) conductive layer 625, or may be made of another material, as appropriate. Conductive layer 695 also may be dispensed with, where solder joint 690 is sufficient to complete the current path.

In the described embodiments, the laser diode arrays are shown as having upper and lower surfaces that are parallel to each other. However, practically speaking, the upper and lower surfaces may not be perfectly parallel, but instead may be substantially parallel. Moreover, the second current path may be laid down along a surface that is not perfectly parallel to the first current path, with the result that the first and second current paths may not be perfectly parallel to each other, but instead may be substantially parallel. For purposes of achieving the goals of the invention, it is sufficient that, over the distance that the first and second current paths travel; the distance between them not change significantly. The degree of acceptable "parallelism" will be a function of the performance goals to be accomplished, and the corresponding degree of necessary decrease in inductance.

In summary, the present invention relates not to laser diode arrays themselves, but rather to current paths into, through, and out of the array. The configurations detailed herein yield lower inductance than previously has been achieved in laser diode arrays, and hence enables much faster rise and fall times, and much faster pulse repetitions.

While the invention has been described with reference to several embodiments, various modifications within the scope and spirit of the invention will be apparent to those of working skill in this technological field. Accordingly, the scope of the invention is to be measured by the appended claims.

What is claimed is:

1. A low-inductance laser diode array comprising:
    at least one electrically mounted laser diode bar;
    a first current path, having a cathode connection point, and extending in a first direction along said array; and
    a second current path, having an anode connection point, and extending in a second direction along said array, said first and second directions being substantially parallel to each other,
    wherein said first and second current paths are separated substantially by a thickness of said array.

2. An array as claimed in claim 1, wherein said first current path extends substantially along a top surface of said array, and said second current path extends substantially along a bottom surface of said array.

3. An array as claimed in claim 1, further comprising an electrically insulative substrate in which said at least one laser diode bar is mounted, the array further comprising metallization around said substrate to define said first and second current paths along with said at least one laser diode bar.

4. An array as claimed in claim 3, further comprising a plurality of laser diode bars mounted in said electrically insulative substrate.

5. An array as claimed in claim 1, further comprising an electrically conductive substrate in which said laser diode bar is mounted, said electrically conductive substrate defining said first and second current paths along with said at least one laser diode bar.

6. An array as claimed in claim 5, further comprising a plurality of laser diode bars mounted in said electrically conductive substrate.

7. A low-inductance laser diode array assembly comprising:
    a laser diode array comprising:
        at least one electrically mounted laser diode bar;
        a first current path, having a cathode connection point, and extending in a first direction along said array; and
        a second current path, having an anode connection point, and extending in a second direction along said array, said first and second directions being substantially parallel to each other,
        wherein said first and second current paths are separated substantially by a thickness of said array;
    said assembly further comprising a heatsink on which said laser diode array is mounted.

8. An assembly as claimed in claim 7, wherein said first current path extends substantially along a top surface of said array, and said second current path extends substantially along a bottom surface of said array.

9. An assembly as claimed in claim 7, further comprising an electrically insulative substrate in which said at least one laser diode bar is mounted, the array further comprising metallization around said substrate to define said first and second current paths along with said at least one laser diode bar.

10. An assembly as claimed in claim 9, further comprising a plurality of laser diode bars mounted in said electrically insulative substrate.

11. An assembly as claimed in claim 7, further comprising an electrically conductive substrate in which said laser diode bar is mounted, said electrically conductive substrate defining said first and second current paths along with said at least one laser diode bar.

12. An assembly as claimed in claim 11, further comprising a plurality of laser diode bars mounted in said electrically conductive substrate.

13. An assembly as claimed in claim 7, further comprising an insulative layer between said heatsink and said array.

14. An assembly as claimed in claim 13, wherein said first current path extends substantially along a top surface of said array, and said second current path extends substantially along a bottom surface of said array.

15. An assembly as claimed in claim 13, further comprising an electrically insulative substrate in which said at least one laser diode bar is mounted, the array further comprising metallization around said substrate to define said first and second current paths along with said at least one laser diode bar.

16. An assembly as claimed in claim 15, further comprising a plurality of laser diode bars mounted in said electrically insulative substrate.

17. An assembly as claimed in claim 13, further comprising an electrically conductive substrate in which said laser diode bar is mounted, said electrically conductive substrate defining said first and second current paths along with said at least one laser diode bar.

18. An assembly as claimed in claim 17, further comprising a plurality of laser diode bars mounted in said electrically conductive substrate.

19. A method of forming a low-inductance laser diode array, said method comprising:
    mounting at least one laser diode bar electrically;
    providing a first current path, having a cathode connection point, and extending in a first direction along said array; and
    providing a second current path, having an anode connection point, and extending in a second direction along said array, said first and second directions being substantially parallel to each other,
    wherein said first and second current paths are separated substantially by a thickness of said array.

20. A method as claimed in claim 19, wherein said first current path extends substantially along a top surface of said array, and said second current path extends substantially along a bottom surface of said array.

21. A method as claimed in claim 20, wherein said first current path extends substantially along a top surface of said array, and said second current path extends substantially along a bottom surface of said array.

22. A method as claimed in claim 20, wherein said mounting comprises mounting said at least one laser diode bar in an electrically insulative substrate, and wherein the method further comprises providing metallization around said substrate to define said first and second current paths along with said at least one laser diode bar.

23. A method as claimed in claim 20, wherein said mounting comprises mounting said at least one laser diode bar in an electrically insulative substrate, wherein said electrically conductive substrate defines said first and second current paths along with said at least one laser diode bar.

24. A method as claimed in claim 20, further comprising providing an insulative layer between said heatsink and said array.

25. A method as claimed in claim 24, wherein said first current path extends substantially along a top surface of said array, and said second current path extends substantially along a bottom surface of said array.

26. A method as claimed in claim 24, wherein said mounting comprises mounting said at least one laser diode bar in an electrically insulative substrate, and wherein the method further comprises providing metallization around said substrate to define said first and second current paths along with said at least one laser diode bar.

27. A method as claimed in claim 26, further comprising mounting a plurality of laser diode bars mounted in said electrically insulative substrate.

28. A method as claimed in claim 24, wherein said mounting comprises mounting said at least one laser diode bar in an electrically insulative substrate, wherein said electrically conductive substrate defines said first and second current paths along with said at least one laser diode bar.

29. A method as claimed in claim 28, further comprising a plurality of laser diode bars mounted in said electrically conductive substrate.

30. A method as claimed in claim 19, wherein said mounting comprises mounting said at least one laser diode bar in an electrically insulative substrate, and wherein the method further comprises providing metallization around said substrate to define said first and second current paths along with said at least one laser diode bar.

31. A method as claimed in claim 30, wherein said mounting comprises mounting a plurality of laser diode bars electrically in said electrically insulative substrate.

32. A method as claimed in claim 31, further comprising mounting a plurality of laser diode bars mounted in said electrically insulative substrate.

33. A method as claimed in claim 19, wherein said mounting comprises mounting said at least one laser diode bar in an electrically conductive substrate, wherein said electrically conductive substrate defines said first and second current paths along with said at least one laser diode bar.

34. A method as claimed in claim 33, further comprising a plurality of laser diode bars mounted in said electrically conductive substrate.

35. A method as claimed in claim 34, further comprising a plurality of laser diode bars mounted in said electrically conductive substrate.

36. A method of forming a low-inductance laser diode array assembly, said method comprising:
forming a laser diode array by a method comprising:
mounting at least one laser diode bar electrically;
providing a first current path, having a cathode connection point, and extending in a first direction along said array; and
providing a second current path, having an anode connection point, and extending in a second direction along said array, said first and second directions being substantially parallel to each other,
wherein said first and second current paths are separated substantially by a thickness of said array;
said method further comprising mounting said laser diode array on a heatsink.

* * * * *